United States Patent
Minegishi et al.

(10) Patent No.: US 8,871,432 B2
(45) Date of Patent: Oct. 28, 2014

(54) PATTERN-FORMING METHOD, RESIST UNDERLAYER FILM, AND COMPOSITION FOR FORMING RESIST UNDERLAYER FILM

(71) Applicant: JSR Corporation, Tokyo (JP)

(72) Inventors: Shin-ya Minegishi, Tokyo (JP); Satoru Murakami, Tokyo (JP); Yushi Matsumura, Tokyo (JP); Kazuhiko Komura, Tokyo (JP); Yoshio Takimoto, Tokyo (JP); Shin-ya Nakafuji, Tokyo (JP); Kyoyu Yasuda, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/852,120

(22) Filed: Mar. 28, 2013

(65) Prior Publication Data

US 2013/0273476 A1    Oct. 17, 2013

Related U.S. Application Data

(63) Continuation of application No. PCT/JP2011/071698, filed on Sep. 22, 2011.

(30) Foreign Application Priority Data

Sep. 29, 2010    (JP) .................................. 2010-219347

(51) Int. Cl.
*G03F 7/26* (2006.01)
*G03F 7/004* (2006.01)
*G03F 7/11* (2006.01)
*G03F 7/40* (2006.01)
*G03F 7/09* (2006.01)
*C08G 8/08* (2006.01)
*C08G 8/22* (2006.01)
*C08G 8/28* (2006.01)
*C09D 161/06* (2006.01)

(52) U.S. Cl.
CPC *G03F 7/004* (2013.01); *G03F 7/11* (2013.01); *G03F 7/26* (2013.01); *G03F 7/40* (2013.01); *G03F 7/094* (2013.01); *C08G 8/08* (2013.01); *C08G 8/22* (2013.01); *C08G 8/28* (2013.01); *C09D 161/06* (2013.01)
USPC ............ 430/322; 430/325; 430/329; 430/331

(58) Field of Classification Search
CPC ......... G03F 7/40; G03F 7/095; G03F 7/0757; G03F 7/094; G03F 7/322; G03F 7/022; G03F 7/004; G03F 7/11; G03F 7/26; G03F 7/425; G03F 7/0048; G03F 21/31138; H01L 21/32139; H01L 21/0272; H01L 21/02052; H01L 21/31133; H01L 21/0273; H01L 21/31138; H01L 21/31144; H01L 21/0271; H01L 21/0276; H01L 27/105
USPC .................................. 430/322, 325, 331, 329
See application file for complete search history.

(56) References Cited

U.S. PATENT DOCUMENTS

| | | | | |
|---|---|---|---|---|
| 5,770,350 | A | * | 6/1998 | Lee ................................ 430/325 |
| 2006/0234158 | A1 | * | 10/2006 | Hatakeyama ............... 430/270.1 |
| 2012/0157367 | A1 | * | 6/2012 | Duong et al. .................. 510/176 |

FOREIGN PATENT DOCUMENTS

| | | | |
|---|---|---|---|
| JP | 2000-143937 | | 5/2000 |
| JP | 2001-040293 | | 2/2001 |
| JP | 2002-014474 | | 1/2002 |
| JP | 2004-168748 | | 6/2004 |
| JP | 2004-177668 | | 6/2004 |
| JP | 2004-240115 | * | 8/2004 |
| JP | 2006-293207 | | 10/2006 |
| JP | 2010-134437 | | 6/2010 |
| WO | WO 2007/105776 | | 9/2007 |

OTHER PUBLICATIONS

International Search Report for corresponding International Application No. PCT/JP2011/071698, Oct. 25, 2011.
Office Action issued Sep. 9, 2014, in Japanese Patent Application No. 2012-536407 (w/ English-language Translation).

* cited by examiner

*Primary Examiner* — Caleen Sullivan
(74) *Attorney, Agent, or Firm* — Oblon, Spivak, McClelland, Maier & Neustadt, L.L.P.

(57) ABSTRACT

A pattern-forming method includes: (1) a resist underlayer film-forming step of providing a resist underlayer film on an upper face side of a substrate by coating a resist underlayer film-forming composition containing a resin having a phenolic hydroxyl group; (2) a resist pattern-forming step of forming a resist pattern on an upper face side of the resist underlayer film; (3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4).

10 Claims, No Drawings

PATTERN-FORMING METHOD, RESIST UNDERLAYER FILM, AND COMPOSITION FOR FORMING RESIST UNDERLAYER FILM

CROSS-REFERENCE TO RELATED APPLICATIONS

The present application is a continuation application of International Application No. PCT/JP2011/071698, filed Sep. 22, 2011, which claims priority to Japanese Patent Application No. 2010-219347, filed Sep. 29, 2010. The contents of these applications are incorporated herein by reference in their entirety.

BACKGROUND OF THE INVENTION

1. Field of the Invention

The present invention relates to a pattern-forming method by a multilayer resist process, a resist underlayer film, and a resist underlayer film-forming composition.

2. Discussion of the Background

In manufacturing integrated circuit elements and the like, a pattern-forming method utilizing a multilayer resist process has been in widespread use to meet miniaturization of processing size. With respect to the multilayer resist process, a resist underlayer film-forming composition is first coated on a substrate, and a photoresist composition is further coated thereon. Then, a mask pattern is transferred to the resist coating film by a stepping projection aligner (i.e., stepper), and subsequent development with a proper developer solution gives a photoresist pattern. Subsequently, the pattern is transferred to the resist underlayer film by dry etching. Finally, the resist underlayer film pattern is transferred to the substrate by dry etching, whereby the substrate with a desired pattern can be obtained. Furthermore, a multilayer resist process involving three or more layers may be employed, in which an intermediate layer is further provided on the surface of the resist underlayer film. Additionally, in the formation of the resist pattern methods other than the photoresist, for example a nanoimprint method, are also used.

In general, materials having a high carbon content are used for the resist underlayer film placed directly on the substrate. A high carbon content leads to the increase in etching selectivity at the time of the processing of the substrate, which enables more precise pattern transfer. Thermosetting phenol novolak resins are particularly well-known as materials for the underlayer film. Additionally, it is known that a composition containing an acenaphthylene based polymer exhibits favorable characteristics as the underlayer film (see Japanese Unexamined Patent Application, Publication Nos. 2000-143937 and 2001-40293).

Since the resist underlayer film becomes useless after the pattern formation by the etching, it is removed by ashing or the like. The ashing is typically a process in which oxygen plasma is generated and organic components in the resist underlayer film are burned out by oxygen radicals in the plasma. However, there is a disadvantage that when the ashing is performed on low dielectric materials used in semiconductor substrates, the surface of the semiconductor substrates made of the low dielectric (Low-k) materials are readily deteriorated, or their relative permittivity is increased, due to their low resistance to ashing. Under such circumstances, a technique for peeling the resist underlayer film with a solution has been proposed (see Japanese Unexamined Patent Application, Publication No. 2004-177668); however according to this technique, peelability is lowered in the case in which the resist underlayer film is peeled after subjecting to an etching step.

SUMMARY OF THE INVENTION

According to one aspect of the present invention, a pattern-forming method includes:

(1) a resist underlayer film-forming step of providing a resist underlayer film on an upper face side of a substrate by coating a resist underlayer film-forming composition containing a resin having a phenolic hydroxyl group;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4).

According to another aspect of the present invention, a resist underlayer film is provided by coating a resist underlayer film-forming composition containing a resin having a phenolic hydroxyl group, the resist underlayer film being hardly soluble in an organic solvent and being soluble in a basic solution.

According to yet another aspect of the present invention, a resist underlayer film-forming composition is for use in a pattern-forming method including:

(1) a resist underlayer film-forming step of providing a resist underlayer film on an upper face side of a substrate by coating a resist underlayer film-forming composition;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4), the resist underlayer film-forming composition containing a resin having a phenolic hydroxyl group.

DESCRIPTION OF THE EMBODIMENTS

One embodiment of the present invention is directed to a pattern-forming method includes:

(1) a resist underlayer film-forming step of providing a resist underlayer film on an upper face side of a substrate by coating a resist underlayer film-forming composition containing a resin having a phenolic hydroxyl group;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4).

According to the pattern-forming method, in the resist underlayer film-removing step after forming the pattern by etching on the substrate, the resist underlayer film is removed by a basic solution; therefore, the substrate which had been subjected to patterning is prevented from being influenced thereon, and the resist underlayer film can be easily removed.

At least a part of the resin having a phenolic hydroxyl group in the resist underlayer film-forming step (1) is preferably modified to have a quinone structure. When the at least a part of the resin having a phenolic hydroxyl group is thus modified to have a quinone structure, solubility of the resist underlayer film in organic solvents is decreased. Therefore, according to the pattern-forming method, the resist underlayer film serves as a layer even if the resin included in the resist underlayer film is not crosslinked, and thus corrosion due to other layer laminated on the upper face of the resist underlayer film by coating or the like can be prevented. In addition, resist underlayer film can exhibit sufficient etching resistance, according to the pattern-forming method. Furthermore, according to the pattern-forming method, when the resist underlayer film comes into contact with a basic solution, the quinone structure is converted back into a phenol structure to turn into such a state as originally coated, whereby the resist underlayer film turns to be soluble in the basic solution and can be readily removed by the basic solution.

The at least a part of the resin having a phenolic hydroxyl group is modified preferably by heating. Such modification of at least a part of the resin having a phenolic hydroxyl group to have a quinone structure by heating enables insolubility in organic solvent to be exhibited without promoting crosslinking, and removal of the resist underlayer film with a basic solution can be further facilitated.

It is preferred that (1') an intermediate layer-forming step of providing an intermediate layer on an upper face side of the resist underlayer film be included after the resist underlayer film-forming step (1) and before the resist pattern-forming step (2), and also the intermediate layer also be dry etched in the pattern-forming step (3). According to the pattern-forming method, even in the case of a multilayer resist process involving three layers, or four or more layers in this manner, the resist underlayer film can be readily removed in the resist underlayer film-removing step.

The resist underlayer film-forming composition contains a crosslinking agent at a content with respect to 100 parts by mass of the resin having a phenolic hydroxyl group of preferably no less than 0 parts by mass and no greater than 3 parts by mass. When the content of the crosslinking agent in the resist underlayer film-forming composition falls within the above range, removal of the resist underlayer film by a basic solution is further facilitated.

The resist underlayer film according to the embodiment of the present invention is formed from a resist underlayer film-forming composition containing a resin having a phenolic hydroxyl group, and is hardly soluble in an organic solvent and soluble in a basic solution. Since the resist underlayer film is hardly soluble in an organic solvent, corrosion due to other layer laminated on the upper face of the resist underlayer film by coating or the like can be prevented and the resist underlayer film serves as a layer. In addition, since the resist underlayer film is soluble in a basic solution, it can be readily removed by a basic solution after pattern formation, with reducing the influence on the substrate.

At least a part of the resin having a phenolic hydroxyl group is preferably modified to have a quinone structure. Since a phenolic hydroxyl group of the resin in the resist underlayer film is modified into a quinone structure, superior insolubility in an organic solvent is achieved. In addition, the resist underlayer film can exhibit sufficient etching resistance. Moreover, when the resist underlayer film comes into contact with a basic solution, the quinone structure is converted back to a phenol structure, whereby the resist underlayer film turns to be soluble in the basic solution. Therefore, the resist underlayer film can be more readily removed by the basic solution.

The resist underlayer film-forming composition according to the embodiment of the present invention is for use in a pattern-forming method including:

(1) a resist underlayer film-forming step of providing a resist underlayer film on an upper face side of a substrate by coating a resist underlayer film-forming composition;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4), the resist underlayer film-forming composition containing a resin having a phenolic hydroxyl group.

The resist underlayer film formed from the resist underlayer film-forming composition can be readily removed after an etching step.

As described in the foregoing, according to the pattern-forming method of the embodiment of the present invention, the substrate is prevented from being influenced thereon, and the resist underlayer film after subjecting to an etching step can be readily removed. In addition, according to the embodiment of the present invention, the resist underlayer film can be readily removed by a basic solution with reducing the influence on the substrate.

Hereinafter, the embodiments of the present invention the pattern-forming method, the resist underlayer film and the resist underlayer film-forming composition of the present invention will be described in detail.

Pattern-Forming Method

The pattern-forming method includes:

(1) a resist underlayer film-forming step of providing a resist underlayer film on an upper face side of a substrate by coating a resist underlayer film-forming composition containing a resin having a phenolic hydroxyl group;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4).

It is to be noted that the pattern-forming method of the embodiment of the present invention may include after the resist underlayer film-forming step (1) and before the resist pattern-forming step (2), (1') an intermediate layer-forming step of forming an intermediate layer on an upper face side of the resist underlayer film, and further the intermediate layer may also be dry etched in the pattern-forming step (3). Hereinafter, each of the steps described above will be explained in more detail.

Resist Underlayer Film-Forming Step (1)

In the resist underlayer film-forming step (1), a resist underlayer film is provided on an upper face side of a substrate by coating a resist underlayer film-forming composition containing a resin having a phenolic hydroxyl group.

The resist underlayer film-forming composition is not particularly limited as long as it is a composition containing a resin having a phenolic hydroxyl group, and for example, a composition described later may be suitably used. It is to be noted that in the embodiment of the present invention, the resin having a phenolic hydroxyl group also involves a resin in which the phenolic hydroxyl group is protected by a dissociable functional group.

The substrate is not particularly limited, and a well-known substrate may be employed. As the substrate, commonly, a substrate made of an inorganic substance is used, and for example, a silicon wafer, a wafer covered with aluminum or the like may be used.

Also, a method for coating the resist underlayer film-forming composition on the substrate is not particularly limited, and for example, any appropriate method such as spin coating, cast coating, or roll coating may be carried out.

At least a part of the resin having a phenolic hydroxyl group in the resist underlayer film-forming step (1) is preferably modified to have a quinone structure. When at least a part of the resin having a phenolic hydroxyl group (1) is thus modified to have a quinone structure, solubility of the resist underlayer film in organic solvents is decreased. Therefore, according to the pattern-forming method, even if the resin included in the resist underlayer film is not crosslinked, the resist underlayer film serves as a layer, and thus corrosion due to other layer laminated on the upper face of the resist underlayer film by coating or the like can be prevented. In addition, resist underlayer film can exhibit sufficient etching resistance, according to the pattern-forming method. Furthermore, according to the pattern-forming method, when the resist underlayer film comes into contact with a basic solution, the quinone structure is converted back into a phenol structure to turn into such a state as originally coated, whereby the resist underlayer film turns to be soluble in the basic solution and can be readily removed by the basic solution.

This modification is conducted before providing other layer such as an intermediate layer and a resist pattern on the upper face of the resist underlayer film. Specifically, the modification may be conduced either on the resin contained in the composition before coating, or on the composition after coating (i.e., coating film).

The resist underlayer film is modified preferably by heating. Such modification of at least a part of the resin having a phenolic hydroxyl group to have a quinone structure enables insolubility in organic solvent to be exhibited without promoting a crosslinking reaction of the resin, and removal of the resist underlayer film with a basic solution can be further facilitated.

The heating for the modification is typically carried out after coating the resist underlayer film-forming composition on the substrate, in ambient air along with drying of the coating film.

The heating temperature in this procedure is preferably no less than 200° C. and no greater than 300° C., and more preferably no less than 230° C. and no greater than 270° C. When the heating temperature is less than 200° C., sufficient modification of the resin having a phenolic hydroxyl group to have a quinone structure fails, whereby corrosion due to the other layer laminated on the upper face of the resist underlayer film by coating or the like may not be prevented. To the contrary, when the heating temperature exceeds 300° C., the crosslinking reaction of the resin having a phenolic hydroxyl group proceeds, and thus the resist underlayer film may not be readily removed by a basic solution in the resist underlayer film-removing step.

The heating time in this procedure is no less than 30 sec and no greater than 600 sec, preferably no less than 60 sec and no greater than 240 sec. When the heating time is less than 30 sec, sufficient modification of the resin having a phenolic hydroxyl group to have a quinone structure fails, whereby corrosion due to the other layer laminated on the upper face of the resist underlayer film by coating or the like may not be prevented. To the contrary, when the heating time exceeds 600 sec, the crosslinking reaction of the resin having a phenolic hydroxyl group proceeds, and thus the resist underlayer film may not be readily removed by a basic solution in the resist underlayer film-removing step.

Furthermore, the ambient oxygen concentration during the heating is preferably no less than 5% by volume, and more preferably no less than 20% by volume. When the oxygen concentration during heat is too low, modification if the resin having a phenolic hydroxyl group to have a quinone structure does not sufficiently proceed, whereby characteristics needed as an underlayer film may not be attained.

The film thickness of the resist underlayer film formed in the resist underlayer film-forming step (1) is not particularly limited, and typically no less than 0.01 μm and no greater than 5 μm.

Resist Underlayer Film-Forming Composition

The resist underlayer film-forming composition used in the pattern-forming method according to the embodiment of the present invention contains a resin having a phenolic hydroxyl group, and other optional component such as a solvent may be also contained.

Resin Having a Phenolic Hydroxyl Group

The resin having a phenolic hydroxyl group is exemplified by a novolak resin, and the like.

Specific examples of the novolak resin include resins obtained by allowing one, or two or more types of phenolic compound selected from the group consisting of phenols such as phenol, cresol, xylenol, resorcinol, bisphenol A, para-tertiary butylphenol, para-octylphenol and fluorenebisphenol, naphthols such as α-naphthol, β-naphthol, 1,5-dihydroxynaphthalene and 2,7-dihydroxynaphthalene, inden-ols such as 1H-inden-4-ol and 1H-inden-6-ol to react with one, or two or more types of aldehydes among aldehyde sources such as formaldehyde, paraformaldehyde and trioxane using an acidic catalyst.

In addition, examples of the resin having a phenolic hydroxyl group include those having a structural unit represented by the following formula (a).

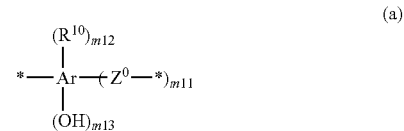

(a)

In the above formula (a), Ar represents an aromatic group having a valency of (m11+m12+m13+1); $R^{10}$ each independently represent a substituted or unsubstituted alkyl group having 1 to 6 carbon atoms, a substituted or unsubstituted alkoxyl group having 1 to 6 carbon atoms, a substituted or unsubstituted alkoxycarbonyl group having 2 to 10 carbon atoms, a substituted or unsubstituted aryl group having 6 to 14 carbon atoms, a substituted or unsubstituted glycidyl ether group, a substituted or unsubstituted alkylglycidyl ether group (wherein, the alkyl moiety has 1 to 6 carbon atoms), or —OR (wherein, R represents a dissociable functional group); $Z^0$ each independently represents a single bond, a methylene group, a substituted or unsubstituted alkylene group having 2 to 20 carbon atoms, a substituted or unsubstituted arylene group having 6 to 14 carbon atoms, or a substituted or unsubstituted alkylene ether group; m11 represents the number of bonding of $Z^0$ bonded to Ar, an integer of 1 to 6; m12 is an integer of 0 to 6; m13 is an integer of 1 to 6; and * denotes an atomic bonding.

Examples of the aromatic group having a valency of at least (m11+m12+m13+1) represented by Ar include groups derived by removing (m11+m12+m13+1) hydrogen atoms from a benzene type aromatic ring such as a benzene ring, a naphthalene ring, an anthracene ring, an indene ring or a fluorenylidene biphenyl ring, heterocyclic aromatic rings such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring and a triazine ring, and the like.

Examples of the resin having a structural unit represented by the above formula (a) include those having a structural unit represented by the following formula (a1) or formula (a2), and the like.

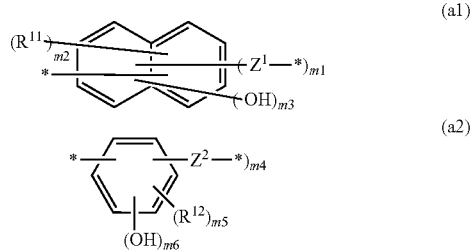

In the above formulae (a1) and (a2), $R^{11}$ and $R^{12}$ each independently represent a substituted or unsubstituted alkyl group having 1 to 6 carbon atoms, a substituted or unsubstituted alkoxyl group having 1 to 6 carbon atoms, a substituted or unsubstituted alkoxycarbonyl group having 2 to 10 carbon atoms, a substituted or unsubstituted aryl group having 6 to 14 carbon atoms, a substituted or unsubstituted glycidyl ether group, a substituted or unsubstituted alkylglycidyl ether group (wherein, the alkyl moiety has 1 to 6 carbon atoms), or —OR (wherein, R represents a dissociable functional group); $Z^1$ and $Z^2$ each independently represent a single bond, a methylene group, a substituted or unsubstituted alkylene group having 2 to 20 carbon atoms, a substituted or unsubstituted arylene group having 6 to 14 carbon atoms, or a substituted or unsubstituted alkylene ether group;

m1 represents the number of bonding of $Z^1$ bonded to an aromatic ring, and is an integer of 1 to 6; m2 is an integer of 0 to 6; m3 is an integer of 1 to 6; m4 represents the number of bonding of $Z^2$ bonded to an aromatic ring, and is an integer of 1 to 4; m5 is an integer of 0 to 4; m6 is an integer of 1 to 5, wherein the sum of m1, m2 and m3 is no greater than 8, and the sum of m4, m5 and m6 is no greater than 6, and wherein in the case where $R^{11}$, $R^{12}$, $Z^1$ and $Z^2$ are each present in a plurality of number, the plurality of $R^{11}$s are each identical or different, the plurality of $R^{12}$s are each identical or different, the plurality of $Z^1$s are each identical or different and the plurality of $Z^2$s are each identical or different; and * denotes an atomic bonding, wherein m1 and m3 each being 2 or greater indicate that two or more $Z^1$ and two or more $Z^2$ are bonded to the aromatic ring, suggesting that the polymer having an aromatic ring has a branched structure or a network structure.

Examples of the unsubstituted alkyl group having 1 to 6 carbon atoms which may be represented by include a methyl group, an ethyl group, a n-propyl group, an i-propyl group, a n-butyl group, a 2-methylpropyl group, a 1-methylpropyl group, a t-butyl group, and the like.

Examples of the unsubstituted alkoxyl group having 1 to 6 carbon atoms which may be represented by $R^{11}$ and $R^{12}$ include a methoxy group, an ethoxy group, a n-propoxy group, an i-propoxy group, a n-butoxy group, a 2-methylpropoxy group, a 1-methylpropoxy group, a t-butoxy group, a 2-propynyloxy group, and the like.

Examples of the unsubstituted alkoxycarbonyl group having 2 to 10 carbon atoms which may be represented by $R^{11}$ and $R^{12}$ include a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, and the like.

Examples of the unsubstituted aryl group having 6 to 14 carbon atoms which may be represented by $R^{11}$ and $R^{12}$ include a phenyl group, a naphthyl group, and the like.

Examples of the unsubstituted alkylglycidyl ether group which may be represented by $R^{11}$ and $R^{12}$ include a methylglycidyl ether group, an ethylglycidyl ether group, a propylglycidyl ether group, a butylglycidyl ether group, and the like.

In addition, the dissociable functional group represented by R is exemplified by: a group that is dissociated in the presence of a base (for example, in a 2.38% by mass tetramethylammonium hydroxide solution at 23° C.) (hereinafter, may be also referred to as "base-labile group"); a group that is dissociated in the presence of an acid; a group that is dissociated by heating during film formation of the resist underlayer film (hereinafter, may be also referred to as "heat-labile group"). Examples of the base-labile group include a fluorine-containing alkylcarbonyl group, a benzyl group, an N-imidemethyl group, and the like. Examples of the acid-labile group include alkoxycarbonyloxy groups such as t-BuOCO—, alkoxy-substituted methyl groups such as a methoxymethyl group, and the like. Examples of the alkoxy heat-labile group include alkoxycarbonylmethyl groups such as specifically, t-BuOCOCH$_2$—, and the like.

Furthermore, examples of the unsubstituted alkylene group having 2 to 20 carbon atoms which may be represented by $Z^1$ and $Z^2$ in the formula (a1) and the formula (a2) include an ethylene group; propylene groups such as a 1,3-propylene group and a 1,2-propylene group; a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the unsubstituted arylene group having 6 to 14 carbon atoms which may be represented by $Z^1$ and $Z^2$ include a phenylene group, a naphthylene group, an anthrylene group, a phenanthrylene group, and the like.

The alkylene moiety of the alkylene ether group which may be represented by $Z^1$ and $Z^2$ preferably has 2 to 20 carbon atoms. Specific examples of the alkylene ether group include an ethylene ether group; propylene ether groups such as a 1,3-propylene ether group and a 1,2-propylene ether group; a tetramethylene ether group, a pentamethylene ether group, a hexamethylene ether group, and the like.

Moreover, the substituent which may be included in each group represented by $R^{10}$, $R^{11}$, $R^{12}$, $Z^0$, $Z^1$ and $Z^2$ in the formulae (a), (a1) and (a2) is exemplified by a halogen atom, a hydroxyl group, an aryl group having 6 to 22 carbon atoms, and the like.

Examples of the halogen atom include a fluorine atom, a chlorine atom, a bromine atom, an iodine atom, and the like.

Further, examples of the an aryl group having 6 to 22 carbon atoms include a phenyl group, a naphthyl group, and the like.

It is to be noted that Mw of the resin having a phenolic hydroxyl group as determined by gel permeation chromatography (GPC) is preferably 1,000 to 50,000, and more preferably 1,500 to 10,000. When the Mw of the resin falls within the above range, the resist underlayer film can be more readily removed by a basic solution in the resist underlayer film-removing step (4).

Solvent

The resist underlayer film-forming composition is typically a liquid state composition which contains a solvent that dissolves the resin as described above.

The solvent is not particularly limited as long as it can dissolve the resin; however, for example, those described in paragraph nos. [0070] to [0073] of Japanese Unexamined Patent Application, Publication No. 2004-168748, and the like may be used.

Among these solvents, propylene glycol monomethyl ether, ethylene glycol monoethyl ether acetate, ethyl lactate, n-butyl acetate, ethyl 3-ethoxypropionate, methyl 3-methoxypropionate; ketones such as 2-heptanone and cyclohexanone; γ-butyrolactone, and the like are preferred.

It is to be noted that the solvent may be used either alone, or at least two types thereof may be used in combination.

The amount of the solvent used typically falls within the range that gives the concentration of the solid content of the resulting composition, and falls within the range of typically 1 to 80% by mass, preferably 3 to 40% by mass, and more preferably 5 to 30% by mass.

Other Components

The resist underlayer film-forming composition may contain other components such as a surfactants, a storage stabilizer, and a defoaming agent.

It is preferred, however, that the resist underlayer film-forming composition is substantially free of any crosslinking agent, since the underlayer film is removed with a basic solution in the resist underlayer film-removing step. The content of the crosslinking agent is preferably no less than 0 parts by mass and no greater than 3 parts by mass, more preferably no less than 0 parts by mass and no greater than 1 part by mass, still more preferably no less than 0 parts by mass and no greater than 0.1 parts by mass, and particularly preferably 0 parts by mass with respect to 100 parts by mass of the resin having a phenolic hydroxyl group.

Intermediate Layer-Forming Step (1')

The intermediate layer formed in this step is a layer for reinforcing the functions possessed by the resist underlayer film and/or the resist coating film or for providing functions with the resist underlayer film and/or the resist film which are not possessed by these films, in forming a resist pattern. In the case in which an antireflective film is, for instance, provided as the intermediate layer, the intermediate film can reinforce the antireflecting function of the resist underlayer film.

The intermediate layer may be formed from an organic compound or an inorganic oxide. As the organic compound, for example, materials commercially available from Brewer Science, Inc. under the trade name "DUV-42", "DUV-44", "ARC-28", "ARC-29" and the like, and materials commercially available from Rohm & Haas Company under the trade name "AR-3", "AR-19" and the like may be used. Moreover, as the inorganic oxide, for example, materials commercially available from JSR Corporation under the trade name "NFC SOG" series, as well as polysiloxane, titanium oxide, oxidized alumina and tungsten oxide provided according to a CVD process may be used.

The method of providing the intermediate layer is not particularly limited, but for example, a coating method, a CVD method or the like may be employed. Of these, the coating method is preferred. When the coating method is employed, the intermediate layer may be successively provided after providing the resist underlayer film.

Furthermore, the film thickness of the intermediate layer is not particularly limited, and may be appropriately selected in accordance with functions required for the intermediate layer. The film thickness of the intermediate layer falls within the range of preferably no less than 10 nm and no greater than 3,000 nm, and more preferably no less than 20 nm and no greater than 300 nm.

Resist Pattern-Forming Step (2)

In the resist pattern-forming step (2), a resist pattern is formed on an upper face side of the resist underlayer film, preferably via the intermediate layer. This resist pattern-forming step is exemplified by: (2-a) a step of using photolithography; (2-b) a step of using a nanoimprinting method; (2-c) a step of using directed self-assembly of a composition; and (2-α) a step performed by way of a reversal process or a sidewall process which may be carried out in addition to each step described above; and the like. Hereinafter, explanation of each step will be given.

(2-a) Step of Using Photolithography

The step of using the photolithography includes, for example, the steps of:

(2-a-1) providing a resist coating film on the resist underlayer film by coating a resist composition (hereinafter, may be also referred to as "step (2-a-1)");

(2-a-2) selectively irradiating the resist coating film with a radioactive ray to expose the resist coating film to radiation (hereinafter, may be also referred to as "step (2-a-2)"); and (2-a-3) developing the exposed resist coating film to form the resist pattern (hereinafter, may be also referred to as "step (2-a-3)").

In the step (2-a-1), a resist coating film is provided on the resist underlayer film using a resist composition. Specifically, after coating the resist composition such that the resultant resist coating film has a predetermined film thickness, the solvent in the coating film is volatilized by prebaking to provide the resist coating film.

Examples of the resist composition include a positive type or negative type chemically amplified resist composition containing a photoacid generating agent, a positive type resist composition including an alkali-soluble resin and a quinonediazide-based sensitizer, a negative type resist composition including an alkali-soluble resin and a crosslinking agent, and the like.

The resist composition for use in forming the resist coating film on the resist underlayer film may have a solid content of usually about 5 to 50% by mass, and in general, the resist composition is subjected to formation of the resist coating film after filtering through a filter with a pore size of about 0.2 μm, for example. It is to be noted that a commercially available resist composition may be used as is in this step.

The coating method of the resist composition is not particularly limited, and for example, a spin coating method or the like may be performed.

In addition, the temperature of the prebaking may be appropriately adjusted in accordance with the type and the like of the resist composition solution used, but is usually about 30 to 200° C., and preferably 50 to 150° C.

In the step (2-a-2), a predetermined region of the resulting resist coating film is irradiated with a radioactive ray to execute selective exposure.

The radioactive ray for use in the exposure is appropriately selected in accordance with the type of the photoacid generating agent used in the resist composition from among visible rays, ultraviolet rays, far ultraviolet rays, X-rays, electron beams, γ-rays, molecular beams, ion beams, and the like. In particular, far ultraviolet rays are preferred, and a KrF excimer laser (wavelength: 248 nm), an ArF excimer laser (wavelength: 193 nm), an $F_2$ excimer laser (wavelength: 157 nm), a $Kr_2$ excimer laser (wavelength: 147 nm), an ArKr excimer laser (wavelength: 134 nm) and extreme ultraviolet rays (wavelength: 13 nm, etc.) and the like are particularly preferred.

In the step (2-a-3), the resist pattern is formed by development of the resist coating film after the exposure with a developer solution.

The developer solution used in this step is appropriately selected in accordance with the type of the resist composition. Specific examples include alkaline aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethyl ammonium hydroxide, tetraethyl ammonium hydroxide, pyrrole, piperidine, choline, 1,8-diazabicyclo[5.4.0]-7-undecene, 1,5-diazabicyclo[4.3.0]-5-nonene or the like, as well as organic solvents.

Also, an appropriate amount of a water-soluble organic solvent, for example, an alcohol such as methanol or ethanol, and a surfactant may be optionally added to the alkaline aqueous solution.

In addition, the resist coating film after developing with the aforementioned developer solution is washed and dried to form a predetermined resist pattern.

It is to be noted that in the step, post-baking may be carried out after the exposure and before the development in order to improve the resolution, pattern profile, developability, and the like. The temperature of the post-baking is appropriately adjusted in accordance with the type and the like of the resist composition used and is usually about 50 to 200° C., and preferably 70 to 150° C.

(2-b) Step of Using Nanoimprinting Method

The step of using a nanoimprinting method (2-b) includes, for example, the steps of:

(2-b-1) providing a resist coating film on the resist underlayer film by coating a resist composition (hereinafter, may be also referred to as "step (2-b-1)"); and (2-b-2) on the resist coating film, pressure welding and releasing a stamper having a fine embossed pattern formed to transfer the embossed pattern of the stamper (hereinafter, may be also referred to as "step (2-b-2)").

The resist composition used in the step (2-b-1) is not particularly limited, and for example, a radiation-sensitive resin composition containing a polymerizable unsaturated compound and a radiation-sensitive polymerization initiator may be used. The coating method of the composition is not particularly limited, and for example, and a spin coating method or the like may be performed.

Conditions of the pressure welding and release of the stamper in the step (2-b-2) are not particularly limited, and may involve, for example, a pressure in pressure welding of preferably no less than 0.1 Mpa and no greater than 100 MPa, and more preferably 0.1 to 50 MPa, as well as a time period of the pressure welding of preferably no less than 1 sec and no greater than 600 sec, and more preferably 1 to 300 sec.

In addition, the stamper may or may not have transparency to radioactive rays. In the case in which the stamper has translucency, and the resist coating film contains a radiation-sensitive polymerization initiator, exposure while subjecting the resist coating film to pressure welding by the stamper enables transfer of protruding parts of the stamper to be facilitated. In this case, the transmittance to the radioactive ray is not particularly limited, and the transmittance is preferably no less than 70%, more preferably 75 to 100%, and still more preferably 80 to 100% with respect to a desired radioactive ray (i.e., a radioactive ray by which the radiation-sensitive polymerization initiator can be sensitized).

In the case in which the exposure is carried out while subjecting the resist coating film to pressure welding by the stamper, the exposure may result in complete curing of the resist coating film, or may result in incomplete curing followed by additional heating carried out in the later step to complete the. The radioactive ray species for use in the exposure is not particularly limited, and a radioactive ray such as a visible light ray, an ultraviolet ray, a far ultraviolet ray, an X-ray, or a charged particle ray such as an electron beam (including an ArF excimer laser (wavelength: 193 nm,) a KrF excimer laser (wavelength: 248 nm), etc.) may be employed.

The stamper may be any one as long it has mechanical characteristics as a stamper, and may further have transparency to radioactive rays as described above. In these respects, a material for constituting the stamper is preferably a translucent inorganic material, in particular. The translucent inorganic material is exemplified by quartzose materials (e.g., quartz (single crystalline or polycrystalline), various types of glass (e.g., quartz glass, fluoride glass, calcium phosphate glass, borate glass, borosilicate glass, etc.)), silicon, spinel, corundum, sapphire, and the like.

The surface of the stamper (a surface having protruding portions) may have a functional layer as needed. The functional layer is exemplified by a releasing layer, an ionization-inhibiting layer, an adhesiveness-improving layer (a layer that improves adhesiveness of various types of interlayers such as an interlayer between the stamper and a translucent electrode layer, etc.), a thermal diffusion layer, various types of optical functional layers (a reflection-inhibiting layer, a refractive index-controlling layer, an optical transparency-improving layer, etc.), an insulating layer, and the like. Only one type of these various types of layers may be used, or two or more types thereof may be used in combination. In other words, for example, each layer may have only one layer, or two or more layers to give a multilayer structure. The thickness of the functional layers is not each particularly limited, but each on layer has a thickness of preferably 1 to 100 nm, more preferably 1 to 50 nm, and particularly preferably 1 to 20 nm.

(2-c) Step of Using Directed Self-Assembly of a Composition

The step of using directed self-assembly of a composition (2-c) includes, for example, the steps of:

(2-c-1) providing a resist coating film on the resist underlayer film by coating a solution containing two types of block copolymers or graft copolymers (hereinafter, may be also referred to as "step (2-c-1)");

(2-c-2) subjecting the resist coating film to microphase separation (hereinafter, may be also referred to as "step (2-c-2)"); and (2-c-3) selectively removing one phase in the resist coating film subjected to microphase separation to form a resist pattern (hereinafter, may be also referred to as "step (2-c-2)").

A solvent used in the solution containing two types of block copolymers or graft copolymers in the step (2-c-1) is preferably a good solvent for the two types of block copolymers or graft copolymers. Further, a solvent having a high boiling point of no less than 150° C. such as, for example, ethylcellosolve acetate (ECA), propylene glycol monomethyl ether acetate (PGMEA) or ethyl lactate (EL) is preferably used so as to be capable of preparing a homogenous solution.

The coating method of the solution is not particularly limited, and for example, a spin coating method or the like may be performed.

In the step of subjecting the resist coating film to microphase separation in the step (2-c-2), for example, annealing the coating film at a temperature of no less than the glass transition temperature of the polymer can form a favorable phase separation structure.

A means for selectively removing one phase in the resist coating film in the step (2-c-3) is exemplified by a method in which the difference in dry etching rate, the difference of disintegration properties with respect to an energy ray or the difference of thermal disintegration properties is utilized between two polymer phases.

(2-α) Step Performed by way of a Reversal Process or a Sidewall Process

The step performed by way of a reversal process includes, for example, the steps of:

(2-α-1) filling in spaces of the resist pattern with a resin composition containing polysiloxane and an organic solvent (hereinafter, may be also referred to as "step (2-α-1)"); and (2-α-2) removing the resist pattern to form a reversal pattern (hereinafter, may be also referred to as "step (2-α-2)").

In the step (2-α-1), spaces of the resist pattern are filled-in with a resin composition. Specifically, on the substrate on which the resist pattern was formed, a resin composition is coated on the substrate by an appropriate coating means such as spin coating, cast coating, or roll coating, whereby the spaces of the resist pattern are filled-in with the resin composition.

It is to be noted that in the step (2-α-1), after filling in the spaces of the resist pattern with the resin composition, a drying step is preferably provided. Although the drying means is not particularly limited, for example, baking enables the organic solvent in the composition to be volatilized. The baking conditions may be appropriately adjusted in accordance with the blend formulation of the resin composition, but the baking temperature is typically 80 to 250° C., and preferably 80 to 200° C. When the baking temperature is 80 to 180° C., a flattening step described later, particularly a flattening processing by a wet etching back method can be smoothly carried out. It is to be noted that the heating time period is typically for 10 to 300 sec, and preferably for 30 to 180 sec.

In the step (2-α-2), the photoresist pattern is removed to form a reversal pattern.

Specifically, a flattening processing for exposing the upper surface of the resist film is first carried out. Then, dry etching, or removal by dissolution removes the resist pattern, whereby a predetermined reversal pattern is obtained.

As a flattening method for use in the flattening processing, an etching method such as dry etching back or wet etching back, as well as a CMP (Chemical Mechanical Polishing) method and the like may be employed. Of these, dry etching back in which a fluorine gas or the like is used, or a CMP method is preferred. It is to be noted that the processing conditions in the flattening processing are not particularly limited, and may be appropriately adjusted.

In addition, for removal of the resist pattern, dry etching is preferred, and specifically, oxygen etching, ozone etching or the like is preferably employed. For the dry etching, a well-known resist peeling apparatus may be used such as an oxygen plasma ashing apparatus or an ozone ashing apparatus. It is to be noted that the etching processing conditions are not particularly limited, and may be appropriately adjusted.

Also, according to the step performed by way of a sidewall process, in place of the step (2-α-1), (2-α-1') a step of coating a resin composition containing polysiloxane and an organic solvent on a sidewall of the resist pattern (hereinafter, may be also referred to as "step (2-α-1')") may be employed. After carrying out the step (2-α-1'), removal of the resist pattern enables a sidewall pattern to be formed having a transferred shape of the sidewall of the resist pattern.

It is to be noted that when the step performed by way of a reversal process or a (2-α) is employed, a reversal pattern or a sidewall pattern is used as a resist pattern in the pattern-forming step (3).

Pattern-Forming Step (3)

In the pattern-forming the step (3), any one selected from the group consisting of the resist underlayer film, the substrate and a combination thereof is subjected to dry etching with the aid of the resist pattern as a mask to form a pattern on the substrate. It is to be noted that if the intermediate layer is formed, the intermediate layer is further dry etched.

The dry etching may be effected using any well-known dry etching apparatus. In addition, depending on the elemental composition of the object to be etched, oxygen atom-containing gases such as $O_2$, CO, and $CO_2$, inert gases such as He, $N_2$, and Ar, chlorine based gases such as $Cl_2$ and $BCl_3$, fluorine based gases such as $CHF_3$ and $CF_4$, other gases such as $H_2$ and $NH_3$ can be used as a source gas in the dry etching. It is to be noted that these gases may also be used in mixture.

Resist Underlayer Film-Removing Step (4)

In the resist underlayer film-removing step (d), the resist underlayer film on the substrate is removed with a basic solution.

The basic solution used in this step is not particularly limited as long as it is basic, and for example basic aqueous solutions such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene and the like may be used. In addition, a suitable amount of a water soluble organic solvent, for example, an alcohol such as methanol, ethanol or the like, or a surfactant may be added to these basic aqueous solutions. Moreover, the basic solution may be a solution in which an organic solvent is used in addition to or instead of water as long as the solution is basic.

The pH of the basic solution is, for example, preferably no less than 7.5, and more preferably no less than 8. If the pH is below 7.5, the resist underlayer film may not be removed sufficiently.

The method of removing the resist underlayer film with the basic solution is not particularly limited, as long as the method allows the resist underlayer film and the basic solution to contact with each other for a certain period of time, and includes, for example, a method of immersing the processed, pattern-formed substrate in the basic solution, a method of spraying the basic solution, a method of coating the substrate with the basic solution, and the like. Further, the immersion time in the immersion method may be, for example, in the range of 0.2 min to 30 min. It is preferred to wash the substrate with water and dry it after the completion of the respective methods.

According to the pattern-forming method of the embodiment of the present invention, since the resist underlayer film is removed with the basic solution in the resist underlayer film-removing step after the pattern is formed on the substrate by etching, as described above, the influence on the substrate can be reduced, and the resist underlayer film can be easily removed. In particular, according to the pattern-forming method of the embodiment of the present invention, even when low dielectric materials, which are susceptible to the influence of asking and the like, are used as the substrate, the resist underlayer film can be removed with reducing the influence on the substrate.

Resist Underlayer Film

The resist underlayer film according to the embodiment of the present invention is formed from a resist underlayer film-forming composition containing a resin having a phenolic hydroxyl group, and is hardly soluble in an organic solvent and soluble in a basic solution.

Detailed explanation of the resist underlayer film is omitted here since the above explanation in connection with the pattern-forming method may be applied.

It is to be noted that the phrase "hardly soluble in organic solvents" means that when an organic solvent or a resist solution containing an organic solvent or the like is applied on the resist underlayer film after the film formation, the resist underlayer film and the applied solvent or solution are immiscible. Specifically, the phrase "hardly soluble in organic solvents" means that the amount of a decrease in the film thickness of the resist underlayer film after the contact with propylene glycol methyl ether acetate at 23° C. for 60 sec as compared with before the contact is less than 1 nm.

Moreover, the phrase "soluble in basic solutions" indicates that when a basic solution is applied on the resist underlayer film after the film formation, the resist underlayer film dissolves in the basic solution, and is removed. Specifically, the phrase "soluble in basic solutions" indicates that the resist underlayer film does not substantially remain after the contact with a 10% by mass aqueous tetramethylammonium hydroxide solution at 50° C. for 60 sec.

Since the resist underlayer film is hardly soluble in organic solvents, the resist underlayer film can inhibit any corrosion due to other layers laminated thereon by coating, and functions as a layer. Furthermore, since the resist underlayer film is soluble in basic solutions, the resist underlayer film can be easily removed with any basic solution after the pattern formation, with reducing the influence on the pattern.

At least a part of the resin having a phenolic hydroxyl group is preferably modified to have a quinone structure. It is to be noted that detailed explanation of the means for modifying at least a part of the resin having a phenolic hydroxyl group to have a quinone structure is omitted here since the above explanation in connection with the pattern-forming method may be applied.

Since a phenolic hydroxyl group of the resin in the resist underlayer film is modified into a quinone structure, superior insolubility in an organic solvent is achieved. Moreover, when the resist underlayer film comes into contact with a basic solution, the quinone structure is converted back to a phenol structure, whereby the resist underlayer film turns to be soluble in the basic solution. Therefore, the resist underlayer film can be more readily removed by the basic solution.

Resist Underlayer Film-Forming Composition

The resist underlayer film according to the embodiment of the present invention-forming composition is for use in a pattern-forming method including:

(1) a resist underlayer film-forming step of providing a resist underlayer film on an upper face side of a substrate by coating a resist underlayer film-forming composition;

(2) a resist pattern-forming step of forming a resist pattern on an upper face side of the resist underlayer film;

(3) a pattern-forming step of dry etching at least the resist underlayer film and the substrate, with the aid of the resist pattern as a mask to form a pattern on the substrate; and (4) a resist underlayer film-removing step of removing the resist underlayer film on the substrate with a basic solution, in the order of (1) to (4), the resist underlayer film-forming composition containing a resin having a phenolic hydroxyl group.

The resist underlayer film formed from the resist underlayer film-forming composition can be readily removed after an etching step. Details of the resist underlayer film-forming composition are as described in connection with the pattern-forming method according to the embodiment of the present invention.

EXAMPLES

The embodiment of the present invention will be explained in more detail below by way of Synthesis Examples and Examples, but the present invention is not limited to these Examples. Herein, the "part" and "%" are on a mass basis unless otherwise stated particularly.

(1) Synthesis of Resin

Synthesis Example 1

In a reaction apparatus equipped with a capacitor, a thermometer and a stirring device were charged 100 parts of 1-naphthol, 100 parts of propylene glycol monomethyl ether acetate and 50 parts of paraformaldehyde, and thereto were added 2 parts of oxalic acid. The temperature was elevated to 120° C. while permitting dehydration, and the reaction was allowed for 5 hrs, whereby a resin (A-1) was obtained. The resulting resin (A-1) had the weight average molecular weight (Mw) of 2,000.

Synthesis Example 2

In a reaction apparatus equipped with a capacitor, a thermometer and a stirring device were charged 50 parts of 2-naphthol, 3,5-dihydroxy-2-naphthoic acid, 100 parts of propylene glycol monomethyl ether acetate and 50 parts of paraformaldehyde, and thereto were added 2 parts of oxalic acid. The temperature was elevated to 120° C. while permitting dehydration, and the reaction was allowed for 5 hrs, whereby a resin (A-2) was obtained. The resulting resin (A-2) had the weight average molecular weight (Mw) of 2,000.

Synthesis Example 3

In a reaction apparatus equipped with a capacitor, a thermometer and a stirring device were charged 100 parts of 2,7-dihydroxynaphthalene, 100 parts of propylene glycol monomethyl ether acetate and 50 parts of paraformaldehyde, and thereto were added 2 parts of oxalic acid. The temperature was elevated to 120° C. while permitting dehydration, and the reaction was allowed for 5 hrs, whereby a resin (A-3) was obtained. The resulting resin (A-3) had the weight average molecular weight (Mw) of 2,000.

Synthesis Example 4

In a reaction apparatus equipped with a capacitor, a thermometer and a stirring device were charged 100 parts of 3-methyl-phenol, 100 parts of propylene glycol monomethyl ether acetate and 100 parts of paraformaldehyde, and thereto were added 3 parts of oxalic acid. The temperature was elevated to 120° C. while permitting dehydration, and the reaction was allowed for 5 hrs, whereby a resin (A-4) was obtained. The resulting resin (A-4) had the weight average molecular weight (Mw) of 8,000.

Synthesis Example 5

In a reaction apparatus equipped with a capacitor, a thermometer and a stirring device were charged 100 parts of resorcinol and 400 parts of ethanol. After heating to 80° C., 120 parts of 4-hydroxybenzaldehyde and 15 parts of concentrated hydrochloric acid were added thereto, and the reaction was allowed for 5 hrs. To this reaction solution were added 1,000 parts of N-methyl-2-pyrrolidone, 800 parts of tert-butyl bromoacetate, 50 parts of tetrabutylammonium bromide and 600 parts of cesium chloride. The temperature of the mixture was elevated to 80° C., and the reaction was allowed for 40 hrs, whereby a resin (A-5) was obtained. The resulting resin (A-5) had the weight average molecular weight (Mw) of 1,600.

Comparative Synthesis Example 1

In a reaction apparatus equipped with a capacitor, a thermometer and a stirring device were charged 100 parts of ethyl 4-vinylbenzenesulfonate and 100 parts of methylethyl ketone. After heating to 80° C., 3 parts of azobisisobutyronitrile were added thereto, and the reaction was allowed for 5 hrs, whereby a resin (B-1) was obtained. The resulting resin (B-1) had the weight average molecular weight (Mw) of 5,000.

(2) Preparation of Resist Underlayer Film-Forming Composition

Preparation Example 1

The resin (A-1) in an amount of 10 parts was dissolved in 90 parts of a solvent (propylene glycol monomethyl ether). This solution was filtered through a membrane filter having a pore size of 0.1 μm to obtain a resin resist underlayer film-forming composition (J-1) of Preparation Example 1.

Preparation Example 2

The resin (A-2) in an amount of 10 parts was dissolved in 90 parts of a solvent (propylene glycol monomethyl ether). This solution was filtered through a membrane filter having a pore size of 0.1 μm to obtain a resin resist underlayer film-forming composition (J-2) of Preparation Example 2.

Preparation Example 3

The resin (A-3) in an amount of 10 parts was dissolved in 90 parts of a solvent (propylene glycol monomethyl ether). This solution was filtered through a membrane filter having a pore size of 0.1 μm to obtain a resin resist underlayer film-forming composition (J-3) of Preparation Example 3.

Preparation Example 4

The resin (A-4) in an amount of 10 parts was dissolved in 90 parts of a solvent (propylene glycol monomethyl ether). This solution was filtered through a membrane filter having a pore size of 0.1 μm to obtain a resin resist underlayer film-forming composition (J-4) of Preparation Example 4.

Preparation Example 5

The resin (A-5) in an amount of 10 parts was dissolved in 90 parts of a solvent (propylene glycol monomethyl ether). This solution was filtered through a membrane filter having a pore size of 0.1 μm to obtain a resin resist underlayer film-forming composition (J-5) of Preparation Example 5.

Comparative Preparation Example 1

The resin (B-1) in an amount of 10 parts was dissolved in 90 parts of a solvent (propylene glycol monomethyl ether). This solution was filtered through a membrane filter having a pore size of 0.1 μm to obtain a resin resist underlayer film-forming composition (j-1) of Comparative Preparation Example 1.

(3) Formation of Resist Underlayer Film

Example 1

The resist underlayer film-forming composition (J-1) prepared in Preparation Example 1 was spin coated on a silicon wafer having a diameter of 8 inch, and thereafter heated on a hot plate at 250° C. for 120 sec to form a resist underlayer film having a film thickness of 0.3 μm.

Examples 2 to 10 and Comparative Examples 1 to 2

Resist underlayer films of Examples 2 to 10 and Comparative Examples 1 to 2 were obtained in a similar manner to Example 1 except that the resist underlayer film-forming composition shown in Table 1 was used, and the heating conditions shown in Table 1 were employed.

It is to be noted that the presence or absence of a quinone structure was verified on the resist underlayer films of Examples 1 to 10 and Comparative Examples 1 to 2 by determination on IR spectroscopy of the resist underlayer film according to a peak at 1,700 to 1,900 cm$^{-1}$. The results are shown in Table 1.

TABLE 1

|  | Resist underlayer film-forming composition | Resin | Heating conditions | Presence or absence of quinone structure | Etching resistance | Organic solvent resistance | Peelability by basic solution |
| --- | --- | --- | --- | --- | --- | --- | --- |
| Example 1 | J-1 | A-1 | 250° C., 120 s | present | A | A | A |
| Example 2 | J-2 | A-2 | 250° C., 120 s | present | A | A | A |
| Example 3 | J-3 | A-3 | 250° C., 120 s | present | A | A | A |
| Example 4 | J-4 | A-4 | 250° C., 120 s | present | A | A | A |
| Example 5 | J-5 | A-5 | 250° C., 120 s | present | A | A | A |
| Example 6 | J-1 | A-1 | 350° C., 120 s | present | A | A | B |
| Example 7 | J-2 | A-2 | 350° C., 120 s | present | A | A | B |
| Example 8 | J-3 | A-3 | 350° C., 120 s | present | A | A | B |

TABLE 1-continued

| | Resist underlayer film-forming composition | Resin | Heating conditions | Presence or absence of quinone structure | Etching resistance | Organic solvent resistance | Peelability by basic solution |
|---|---|---|---|---|---|---|---|
| Example 9 | J-4 | A-4 | 350° C., 120 s | present | A | A | B |
| Example 10 | J-5 | A-5 | 350° C., 120 s | present | A | A | B |
| Comparative Example 1 | j-1 | B-1 | 250° C., 120 s | absent | C | A | C |
| Comparative Example 2 | j-1 | B-1 | 350° C., 120 s | absent | C | A | C |

Evaluations

The following evaluations of each of Examples 1 to 10 and Comparative Examples 1 to 2 were made. The results are shown in Table 1.

Etching Resistance

On a silicon wafer having a diameter of 8 inch, each of the compositions for forming a resist underlayer film obtained was spin coated, and then heated on a hot plate under conditions shown in Table 1 to provide a resist underlayer film having a film thickness of 300 nm. This resist underlayer film was subjected to an etching process using an etching apparatus "EXAM" (manufactured by SHINKO SEIKI Co. Ltd., with $CF_4$/Ar ($CF_4$: 100 mL/min; Ar: 100 mL/min; and RF power: 200 W). Then, the etching rate was determined by measuring the film thicknesses before and after the etching process, and the etching resistance was evaluated according to the following criteria.

"A (favorable)": the etching rate being no greater than 150 nm/min; and

"C (unfavorable)": the etching rate being greater than 150 nm/min

Organic Solvent Resistance

On a silicon wafer having a diameter of 8 inch, each of the compositions for forming a resist underlayer film obtained was spin coated, and then heated on a hot plate under conditions shown in Table 1 to provide a resist underlayer film having a film thickness of 300 nm. This resist underlayer film was coated with 20 mL of propylene glycol monomethyl ether acetate, and lest to stand still at 23° C., under 1 atmospheric pressure for 60 sec, followed by drying. The film thickness of the underlayer film on the silicon wafer was measured to determined the amount of decreased film thickness of the underlayer film, and the organic solvent resistance was evaluated according to the following criteria. It is to be noted that the result of evaluation of A or B can lead to a decision of being sufficiently usable as an underlayer film.

"A (favorable)": amount of a decreased film thickness of the resist underlayer film being less than 1 nm "B (moderate)": amount of a decreased film thickness of the resist underlayer film being no less than 1 nm and less than 5 nm "C (unfavorable)": amount of a decreased film thickness of the resist underlayer film being no less than 5 nm Peelability by Basic Solution On a silicon wafer having a diameter of 8 inch, a coating type Low-k film having a film thickness of 0.2 μm was provided, and each resist underlayer film-forming composition obtained was spin coated thereon, followed by heating on a hot plate under conditions shown in Table 1 to form a resist underlayer film having a film thickness of 0.3 μm. Thereafter, a solution of a silicon-containing intermediate layer composition for three-layer resist process was spin-coated on the resultant resist underlayer film, and heated at 200° C. for 60 sec to form an intermediate layer coating film having a film thickness of 0.05 μm. Next, a resist composition solution for ArF was spin-coated on the intermediate layer coating film obtained, and prebaked on a hot plate at 130° C. for 90 sec to form a resist coating film having a film thickness of 0.2 μm. On this laminate, an ArF resist layer was peeled using an etching apparatus "EXAM" (manufactured by Shinko Seiki Co., Ltd.) with $O_2$ ($O_2$: 100 mL/min; RF power: 100 W), and subsequently, the silicon-containing intermediate layer was peeled with $CF_4$/Ar ($CF_4$: 100 mL/min, Ar: 100 mL/min; RF power: 100 W). Furthermore, after completely peeling the silicon-containing intermediate layer, the resist underlayer film was subjected to etching with $CF_4$/Ar ($CF_4$: 100 mL/min, Ar: 100 mL/min; RF power: 100 W). The film thus subjected to an etching gas treatment was immersed in a 10% aqueous tetramethylammonium hydroxide solution at 50° C. for 10 min, and then immersed in 2-propanol for 10 min, followed by washing with water and drying. The film thickness of the underlayer film on the silicon wafer was measured to determine the film thickness of the underlayer film residual film, and an evaluation on peelability of the underlayer film in solvents was made in accordance with the following criteria. It is to be noted that when the result of the evaluation was A or B, the film can be decided to be readily removed by a basic solution.

"A (favorable)": film thickness of the residual resist underlayer film being less than 5 nm "B (moderate)": film thickness of the residual resist underlayer film being no less than 5 nm and less than 10 nm "C (unfavorable)": film thickness of the residual resist underlayer film being no less than 10 nm As shown in Table 1, it was proven that each resist underlayer film obtained in Examples 1 to 10 had etching resistance and organic solvent resistance sufficient as a resist underlayer film, and that the film was readily removed after etching by a basic solution (i.e., an aqueous tetramethylammonium hydroxide solution). In particular, it was revealed that each resist underlayer film obtained in Examples 1 to 5 was particularly superior in the organic solvent resistance and the peelability by a basic solution, with a favorable heating condition. Moreover, it was confirmed that no particular influence such as deformation was found on the pattern of the Low-k film formed in the evaluation of peelability by a basic solution even after immersion in the basic solution.

The pattern-forming method according to the embodiment of the present invention enables a resist pattern to be efficiently formed since the resist underlayer film can be readily removed, with reducing the influence on the substrate; therefore, the pattern-forming method can be suitably employed in manufacture of integrated circuit elements and the like in which a low-dielectric material has been used, in particular.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method sequentially comprising the steps of:
   (1) providing a resist underlayer film on an upper face side of a substrate by coating a resist underlayer film-forming composition containing a resin having phenolic structures, each of the phenolic structures has a phenolic hydroxyl group;
   (2) forming a resist pattern on an upper face side of the resist underlayer film;
   (3) dry etching at least the resist underlayer film and the substrate, with the aid of the resist pattern as a mask to form a pattern on the substrate; and
   (4) removing the resist underlayer film on the substrate with a basic solution, wherein at least a part of the phenolic structures of the resin in the step of providing a resist underlayer film are modified to quinone structures which replace the at least a part of the phenolic structures, and wherein the resin is heated at a temperature of at least 200° C. under an ambient oxygen concentration of no less than 5% by volume to modify the at least a part of the phenolic structures.

2. The pattern-forming method according to claim 1, wherein the method further comprises the step of
   (1') providing an intermediate layer on an upper face side of the resist underlayer film, after the step of providing a resist underlayer film (1) and before the step of forming a resist pattern (2), and wherein
   the intermediate layer is also dry etched in the step of forming a pattern (3).

3. The pattern-forming method according to claim 1, wherein the resist underlayer film-forming composition comprises a crosslinking agent at a content with respect to 100 parts by mass of the resin of no less than 0 parts by mass and no greater than 3 parts by mass.

4. The pattern-forming method according to claim 1, wherein the resin is heated at a temperature of 200° C. to 300° C. under an ambient oxygen concentration of no less than 5% by volume to modify the at least a part of the phenolic structures.

5. The pattern-forming method according to claim 1, wherein the basic solution includes tetramethylammonium hydroxide or tetraethylammonium hydroxide.

6. A resist underlayer film provided by coating a resist underlayer film-forming composition comprising a resin having phenolic structures, each of the phenolic structures has a phenolic hydroxyl group, the resist underlayer film being hardly soluble in an organic solvent and soluble in a basic solution, wherein at least a part of the phenolic structures of the resin are modified to quinone structures which replace the at least a part of the phenolic structures, and wherein the resin is heated at a temperature of at least 200° C. under an ambient oxygen concentration of no less than 5% by volume to modify the at least a part of the phenolic structures.

7. The resist underlayer film according to claim 6, wherein the resin is heated at a temperature of 200° C. to 300° C. under an ambient oxygen concentration of no less than 5% by volume to modify the at least a part of the phenolic structures.

8. A resist underlayer film-forming composition that is for use in a pattern-forming method sequentially comprising:
   (1) providing a resist underlayer film on an upper face side of a substrate by coating a resist underlayer film-forming composition;
   (2) forming a resist pattern on an upper face side of the resist underlayer film;
   (3) dry etching at least the resist underlayer film and the substrate, with the aid of the resist pattern as a mask to form a pattern on the substrate; and
   (4) removing the resist underlayer film on the substrate with a basic solution, the resist underlayer film-forming composition comprising a resin having phenolic structures, each of the phenolic structures has a phenolic hydroxyl group, wherein at least a part of the phenolic structures of the resin in the step of providing a resist underlayer film are modified to quinone structures which replace the at least a part of the phenolic structures, and wherein the resin is heated at a temperature of at least 200° C. under an ambient oxygen concentration of no less than 5% by volume to modify the at least a part of the phenolic structures.

9. The resist underlayer film-forming composition according to claim 8, wherein the resin is heated at a temperature of 200° C. to 300° C. under an ambient oxygen concentration of no less than 5% by volume to modify the at least a part of the phenolic structures.

10. The resist underlayer film-forming composition according to claim 8, wherein the basic solution includes tetramethylammonium hydroxide or tetraethylammonium hydroxide.

* * * * *